US011965933B2

(12) United States Patent
Matsukawa et al.

(10) Patent No.: US 11,965,933 B2
(45) Date of Patent: Apr. 23, 2024

(54) INTEGRATED CIRCUIT, BATTERY MONITORING DEVICE, AND BATTERY MONITORING SYSTEM

(71) Applicant: NUVOTON TECHNOLOGY CORPORATION JAPAN, Kyoto (JP)

(72) Inventors: Kazuo Matsukawa, Osaka (JP); Yu Okada, Osaka (JP); Yosuke Goto, Osaka (JP); Hitoshi Kobayashi, Osaka (JP); Keiichi Fujii, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 689 days.

(21) Appl. No.: 17/132,225

(22) Filed: Dec. 23, 2020

(65) Prior Publication Data

US 2021/0109162 A1   Apr. 15, 2021

Related U.S. Application Data

(63) Continuation of application No. PCT/JP2019/020909, filed on May 27, 2019.

(30) Foreign Application Priority Data

Jun. 27, 2018 (JP) .................................. 2018-122482

(51) Int. Cl.
*G01R 31/3842* (2019.01)
*G01R 31/389* (2019.01)
(Continued)

(52) U.S. Cl.
CPC ....... *G01R 31/3842* (2019.01); *G01R 31/389* (2019.01); *H01M 10/48* (2013.01); *H01M 50/569* (2021.01)

(58) Field of Classification Search
CPC .......................... H01M 50/569; H01M 10/48; G01R 31/3842; G01R 31/389
(Continued)

(56) References Cited

U.S. PATENT DOCUMENTS 6,002,238 A    12/1999  Champlin
6,172,483 B1    1/2001  Champlin
(Continued)

FOREIGN PATENT DOCUMENTS

JP    2002-525586 A    8/2002
JP       5403437 B2    1/2014
(Continued)

OTHER PUBLICATIONS

International Search Report and Written Opinion dated Jul. 2, 2019 in International Application No. PCT/JP2019/020909; with partial English translation.
(Continued)

*Primary Examiner* — James M Erwin
(74) *Attorney, Agent, or Firm* — Rimon P.C.

(57) ABSTRACT

A battery monitoring device includes: a pair of terminals for measuring voltage or current of a battery, and to which a filter unit including a capacitive element is connected; an AD converter that measures a waveform of voltage between the terminals during charging or discharging of the capacitive element; and a time constant calculation unit that calculates a time constant of the filter unit based on the waveform measured. The AD converter is, for example, a first AD converter or a second AD converter. The filter unit is, for example, a first filter unit or a second filter unit.

12 Claims, 6 Drawing Sheets

(51) Int. Cl.
*H01M 10/48* (2006.01)
*H01M 50/569* (2021.01)

(58) Field of Classification Search
USPC .......................................... 429/90
See application file for complete search history.

(56) References Cited

U.S. PATENT DOCUMENTS

| | | |
|---|---|---|
| 6,262,563 B1 | 7/2001 | Champlin |
| 6,294,896 B1 | 9/2001 | Champlin |
| 2013/0030596 A1 | 1/2013 | Okada et al. |
| 2016/0061909 A1 | 3/2016 | Ino et al. |
| 2016/0169945 A1* | 6/2016 | Mauder ............... H01H 1/0015 324/126 |
| 2017/0117596 A1 | 4/2017 | Kubo |
| 2017/0168094 A1* | 6/2017 | Chikamatsu ........... G01R 15/18 |
| 2019/0143839 A1* | 5/2019 | Kitamoto ............... B60L 58/40 701/22 |

FOREIGN PATENT DOCUMENTS

| | | |
|---|---|---|
| JP | 2016-050870 A | 4/2016 |
| JP | 2017-078658 A | 4/2017 |
| JP | 2017-175757 A | 9/2017 |

OTHER PUBLICATIONS

Japanese Office Action dated May 30, 2023 issued in the corresponding Japanese Patent Application No. 2020-527297.

* cited by examiner

INTEGRATED CIRCUIT, BATTERY MONITORING DEVICE, AND BATTERY MONITORING SYSTEM

CROSS REFERENCE TO RELATED APPLICATIONS

This application is a U.S. continuation application of PCT International Patent Application Number PCT/JP2019/020909 filed on May 27, 2019, claiming the benefit of priority of Japanese Patent Application Number 2018-122482 filed on Jun. 27, 2018, the entire contents of which are hereby incorporated by reference.

BACKGROUND

1. Technical Field

The present disclosure relates to a battery monitoring device that monitors the state of a battery.

2. Description of the Related Art

Vehicles that travel by using a secondary battery as a power supply, such as hybrid electric vehicles (HEVs) and electric vehicles (EVs), have been developed. Techniques are also known in which a battery management system (BMS) is used to estimate the amount of remaining battery power and to detect abnormalities for the safe use of a secondary battery. As such a BMS, Japanese Patent No. 5403437 discloses a battery monitoring device that can monitor the battery state in real time.

SUMMARY

The present disclosure provides an integrated circuit capable of calculating a time constant of a filter unit connected to terminals for measuring voltage or current of a battery. The present disclosure also provides a battery monitoring device and a battery monitoring system that include the above integrated circuit.

An integrated circuit according to one aspect of the present disclosure includes: terminals which are a pair, for measuring voltage or current of a battery, and to which a filter unit including a capacitive element is connected; an analog-to-digital (AD) converter that measures a waveform of voltage between the terminals during charging or discharging of the capacitive element; and a time constant calculation unit that calculates a time constant of the filter unit based on the waveform measured.

A battery monitoring device according to one aspect of the present disclosure includes: the above-described integrated circuit; and the filter unit.

A battery monitoring system according to one aspect of the present disclosure includes: the above-described battery monitoring device; and the battery.

An aspect of the present disclosure realizes an integrated circuit capable of calculating a time constant of a filter unit connected to terminals for measuring voltage or current of a battery. Furthermore, an aspect of the present disclosure realizes a battery monitoring device and a battery monitoring system that include the above integrated circuit.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments will be described with reference to the Drawings. It should be noted that each of the subsequently-described embodiments shows a generic or specific example of the present disclosure.

The numerical values, shapes, materials, structural components, the arrangement and connection of the structural components, steps, the processing order of the steps, etc. shown in the following embodiments are mere examples, and thus are not intended to limit the present disclosure.

Furthermore, among the structural components described in the following embodiments, structural components not recited in any one of the independent claims are described as optional structural components.

It should be noted that the respective figures are schematic diagrams, and thus are not necessarily accurate illustrations. Furthermore, in the figures, elements which are substantially the same are given the same reference signs, and overlapping description may be omitted or simplified.

Embodiment 1

[Configuration]

Figure 1:
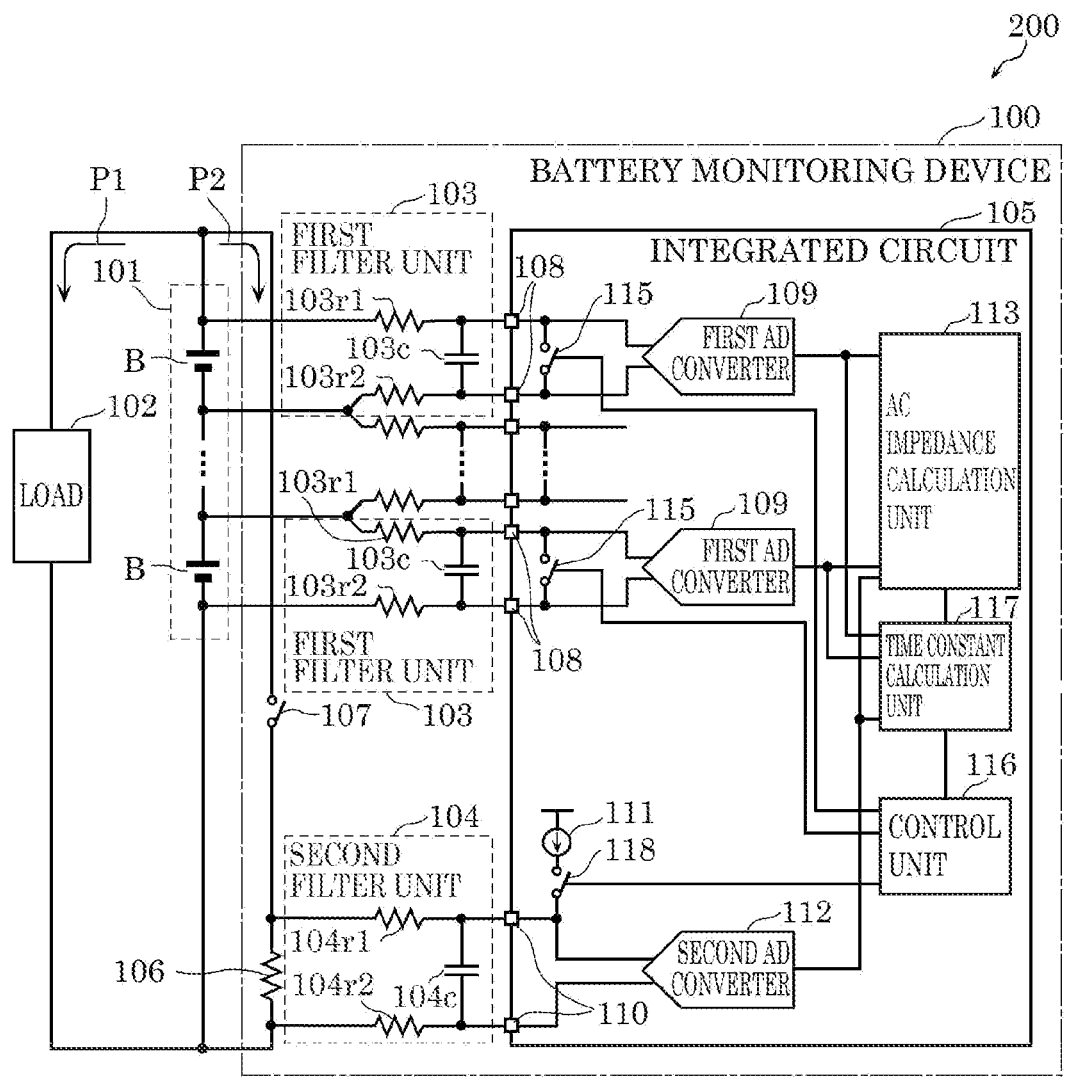
FIG. 1 is a block diagram of a functional configuration of a battery monitoring system according to Embodiment 1.

First, the configuration of a battery monitoring system according to Embodiment 1 will be described. FIG. 1 is a block diagram of a functional configuration of the battery monitoring system according to Embodiment 1.

Battery monitoring system 200 shown in FIG. 1 includes battery monitoring device 100 and battery pack 101. Battery monitoring device 100 monitors the state of battery pack 101. Battery pack 101 includes batteries B. Batteries B are, in other words, battery cells. Batteries B are specifically lithium-ion batteries, but may be other types of batteries such as nickel-metal hydride batteries. Battery pack 101 functions as a power supply for load 102, and supplies power to load 102. Exemplary load 102 is, although not limited to, a motor of an EV. Instead of load 102, a charging device for charging battery pack 101 may be connected at the position of load 102.

Specifically, battery monitoring device 100 can calculate and monitor the AC impedance of each battery B. The AC impedance of battery B is used for, for example, calculating the degree of deterioration of battery B. For example, the degree of deterioration of battery B is represented as a parameter called SOH (State of Health).

Battery monitoring device 100 includes first filter units 103, second filter unit 104, integrated circuit 105, resistor 106, and switch 107. Integrated circuit 105 includes pairs of first terminals 108, first analog to digital (AD) converters 109, second terminals 110, power supply 111, second AD converter 112, AC impedance calculation unit 113, first switches 115, control unit 116, time constant calculation unit 117, and second switch 118.

First terminals 108 are pairs of terminals for measuring the voltages of batteries B. First terminals 108 (more specifically, the pairs of first terminals) are in one-to-one correspondence with batteries B. Each battery B is connected between a pair of first terminals 108 via first filter unit 103.

First AD converters 109 are measures that measure the voltages of batteries B. First AD converters 109 are in one-to-one correspondence with batteries B. Each first AD converter 109 converts the voltage (that is, an analog signal) across one battery B into a digital signal. First AD converters 109 are delta-sigma AD converters, for example.

First AD converters 109 in integrated circuit 105 all have the same AD conversion characteristics. AD conversion characteristics are parameters such as resolution (the number of bits). Specifically an identical AD converter product is used as first AD converters 109. This can reduce measurement errors among the voltages of batteries B due to AD conversion.

Second terminals 110 are a pair of terminals for measuring the current of batteries B. Resistor 106 is connected between second terminals 110 via second filter unit 104.

Resistor 106 is placed in path P2, which is different from path P1 of the current flowing from battery pack 101 to load 102. That is, resistor 106 does not receive the current flowing through load 102. Resistor 106 is serially connected with battery pack 101. Resistor 106 is, for example, a discrete part external to integrated circuit 105.

Switch 107 is a switch for allowing current to flow from battery pack 101 to resistor 106. Switch 107 is an FET (Field Effect Transistor), for example, but may be a bipolar transistor. Switch 107 is controlled to be on and off by, for example, control unit 116 in integrated circuit 105.

Thus, with resistor 106 placed in path P2, turning switch 107 on allows current to flow from battery pack 101 to resistor 106 irrespective of whether or not battery pack 101 is being charged or discharged. That is, the current of batteries B can be measured irrespective of whether or not battery pack 101 is being charged or discharged.

Second AD converter 112 is a measure that measures the current flowing through resistor 106. Specifically, second AD converter 112 converts the voltage (that is, an analog signal) across resistor 106 into a digital signal. Second AD converter 112 is a delta-sigma AD converter, for example. Second AD converter 112 is, for example, an AD converter with the same AD conversion characteristics as first AD converters 109 (that is, an identical product). This can reduce measurement errors occurring between first AD converters 109 and second AD converter 112 due to AD conversion.

AC impedance calculation unit 113 calculates the AC impedances of batteries B based on the voltages of batteries B measured by first AD converters 109 and on the current of battery pack 101 measured by second AD converter 112 (that is, the current of batteries B). Specifically AC impedance calculation unit 113 calculates the AC impedance of each battery B by converting the voltage of battery B into a complex voltage, converting the current of battery B into a complex current, and dividing the complex voltage by the complex current.

[Calculating Time Constant of First Filter Unit]

In order to eliminate noise in measuring the voltages of batteries B, first filter units 103 are connected to the respective pairs of first terminals 108. Specifically, each first filter unit 103 is a low-pass filter. First filter unit 103 is a filter circuit that includes resistor 103r1, resistor 103r2, and capacitive element 103c. Because capacitive element 103c in first filter unit 103 requires a large capacitance, first filter unit 103 is difficult to include in integrated circuit 105. First filter unit 103 is therefore implemented with discrete parts and provided externally to integrated circuit 105.

Implementing first filter unit 103 with discrete parts may increase the deviation of the time constant of first filter unit 103 from a designed value. If the time constant can be calculated, the accuracy of calculating the AC impedance can be increased by correcting the AC impedance according to the time constant.

To this end, integrated circuit 105 has a function of calculating the time constants of first filter units 103. As components for calculating the time constants of first filter units 103, integrated circuit 105 includes first switches 115, control unit 116, and time constant calculation unit 117.

First switches 115 are provided for the respective pairs of first terminals 108, and switch first terminals 108 between a short-circuit state and an open state. First switches 115 are FETs, for example, but may be other switching elements such as bipolar transistors.

Control unit 116 discharges capacitive element 103c in each first filter unit 103. Control unit 116 discharges capacitive element 103c by outputting a control signal to turn first switch 115 on and short-circuiting first terminals 108. Control unit 116 is implemented by a microcomputer or a processor, for example.

Time constant calculation unit 117 calculates the time constant of each first filter unit 103 based on the waveform of the voltage between first terminals 108 (that is, the waveform of the voltage across capacitive element 103c) occurring when capacitive element 103c is being charged by battery B immediately after discharged. Time constant calculation unit 117 is implemented by a microcomputer or a processor, for example.

Figure 2:
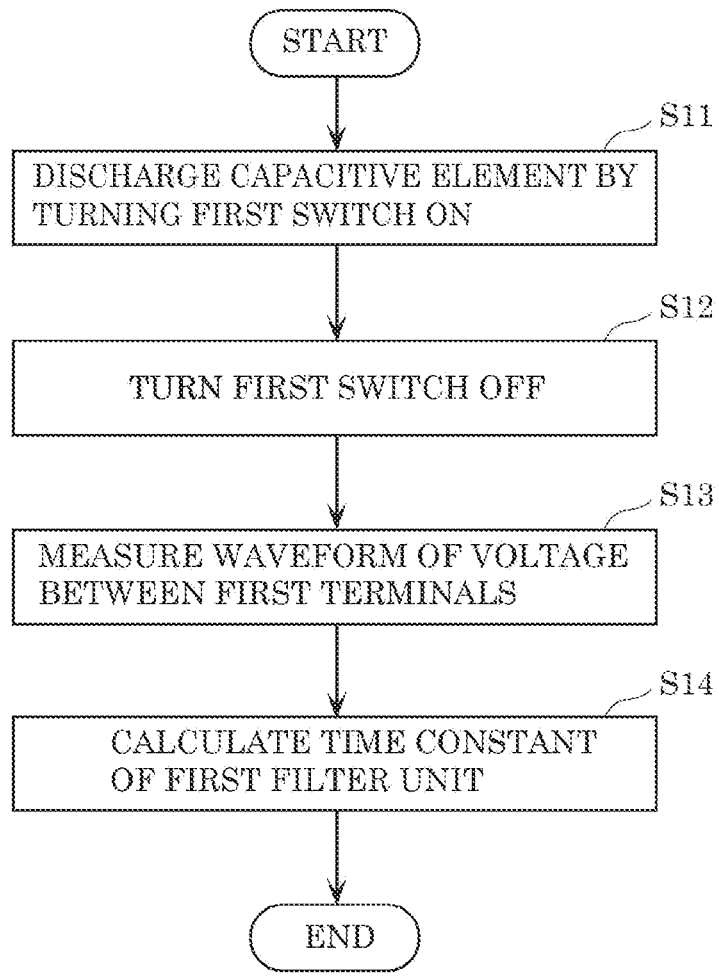
FIG. 2 is a flowchart of operations for calculating a time constant of a first filter unit.
Figure 3:
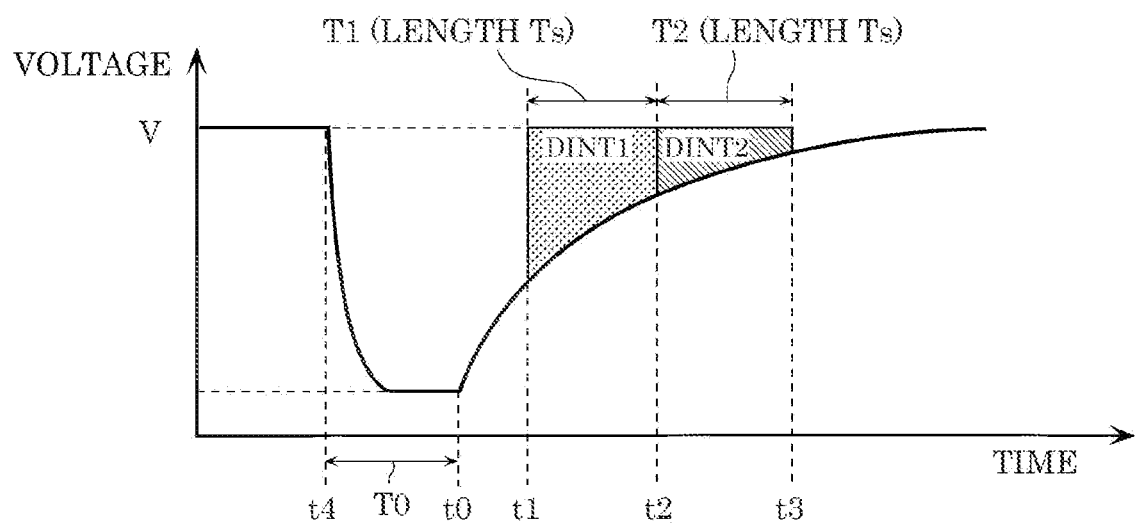
FIG. 3 is a diagram showing a voltage waveform for describing a method of calculating the time constant of the first filter unit.

Operations for calculating the time constant with the above components will be described below. FIG. 2 is a flowchart of the operations for calculating the time constant of first filter unit 103. FIG. 3 is a diagram showing a voltage waveform for describing a method of calculating the time constant of first filter unit 103.

As shown in FIG. 3, normally, a voltage V of battery B is applied to capacitive element 103c. Under this situation, control unit 116 discharges capacitive element 103c by turning first switch 115 on (S11). Specifically, control unit 116 turns first switch 115 on at time t4 in FIG. 3 and maintains first switch 115 on during interval T0 up to time t0 (a discharge interval).

At time t0, control unit 116 turns first switch 115 off (S12). This causes battery B to start charging capacitive element 103c. First AD converter 109 measures the waveform of the voltage between first terminals 108 during the charging of capacitive element 103c (S13). That is, first AD converter 109 measures the waveform of the voltage across capacitive element 103c during the charging of capacitive element 103c.

The voltage across capacitive element 103c reaches the voltage V upon a lapse of a period corresponding to the time constant of first filter unit 103. Time constant calculation unit 117 then calculates the time constant of first filter unit 103 based on the waveform measured by first AD converter 109 (S14). Although the specific method of calculating the time constant is not limited, an exemplary method of calculating the time constant will be described below.

Time constant calculation unit 117 calculates the time constant of first filter unit 103 based on, for example, an integral value DINT1 in first interval T1 of the waveform measured and an integral value DINT2 in second interval T2 of the waveform measured. Second interval T2 is different from first interval T1. First interval T1 spans from time t1 to time t2 while second interval T2 spans from time t2 to time t3. That is, first interval T1 and second interval T2 are continuous. First interval T1 and second interval T2 may be of any length.

The waveform x of the voltage across capacitive element 103c during the charging of capacitive element 103c is expressed by Equation 1 below with a time constant $\tau$, and the integral value of the waveform x is expressed by Equation 2 below.

[Math. 1]

$$x(t) = e^{-\frac{t}{\tau}} \quad \text{Equation 1}$$

$$\int x(t)dt = -\tau e^{-\frac{t}{\tau}} \quad \text{Equation 2}$$

The integral value DINT1 is divided by the integral value DINT2 as in Equation 3 below, where Ts is the length of first interval T1 and also the length of second interval T2. Equation 3 is transformed to obtain the time constant $\tau$ as in Equation 4 below.

[Math. 2]

$$\frac{DINT1}{DINT2} = \frac{-\tau e^{-\frac{t2}{\tau}} + \tau e^{-\frac{t1}{\tau}}}{-\tau e^{-\frac{t3}{\tau}} + \tau e^{-\frac{t2}{\tau}}} \quad \text{Equation 3}$$

$$= \frac{-e^{-\frac{t2}{\tau}} + e^{-\frac{t1}{\tau}}}{-e^{-\frac{t3}{\tau}} + e^{-\frac{t2}{\tau}}}$$

$$= \frac{-e^{-\frac{t1+Ts}{\tau}} + e^{-\frac{t1}{\tau}}}{e^{-\frac{t1+2Ts}{\tau}} - e^{-\frac{t1+Ts}{\tau}}}$$

$$= \frac{e^{-\frac{Ts}{\tau}} - 1}{e^{-\frac{Ts}{\tau}}\left(e^{-\frac{Ts}{\tau}} - 1\right)}$$

$$= e^{\frac{Ts}{\tau}}$$

$$\tau = \frac{Ts}{\ln\frac{DINT1}{DINT2}} \quad \text{Equation 4}$$

In this manner, time constant calculation unit 117 can calculate the time constant of first filter unit 103 based on the waveform measured by first AD converter 109.

[Calculating Time Constant of Second Filter Unit]

In order to eliminate noise in measuring the current of batteries B, second filter unit 104 is connected to second terminals 110. Specifically, second filter unit 104 is a low-pass filter. Second filter unit 104 is a filter circuit that includes resistor 104r1, resistor 104r2, and capacitive element 104c. Because capacitive element 104c in second filter unit 104 requires a large capacitance, second filter unit 104 is difficult to include in integrated circuit 105. Second filter unit 104 is therefore implemented with discrete parts and provided externally to integrated circuit 105.

Implementing second filter unit 104 with discrete parts may increase the deviation of the time constant of second filter unit 104 from a designed value. If the time constant can be calculated, the accuracy of calculating the AC impedance can be increased by correcting the AC impedance according to the time constant.

To this end, integrated circuit 105 has a function of calculating the time constant of second filter unit 104. As components for calculating the time constant of second filter unit 104, integrated circuit 105 includes second switch 118 in addition to above-described control unit 116 and time constant calculation unit 117.

Second switch 118 is provided between power supply 111 and second terminals 110, and switches on and off the electrical connection between power supply 111 and capacitive element 104c. Second switch 118 is an FET, for example, but may be a bipolar transistor. Although power supply 111 is shown as a current source in FIG. 1, power supply 111 may be a voltage source.

Figure 4:
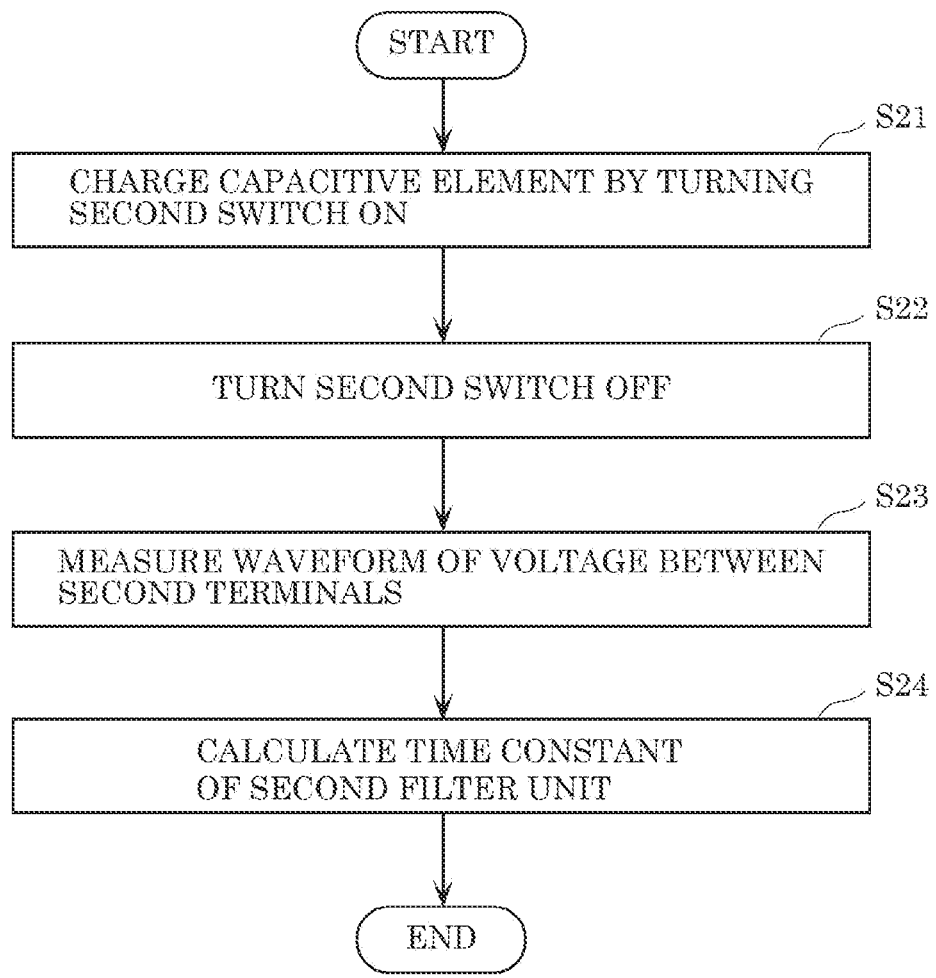
FIG. 4 is a flowchart of operations for calculating a time constant of a second filter unit.
Figure 5:
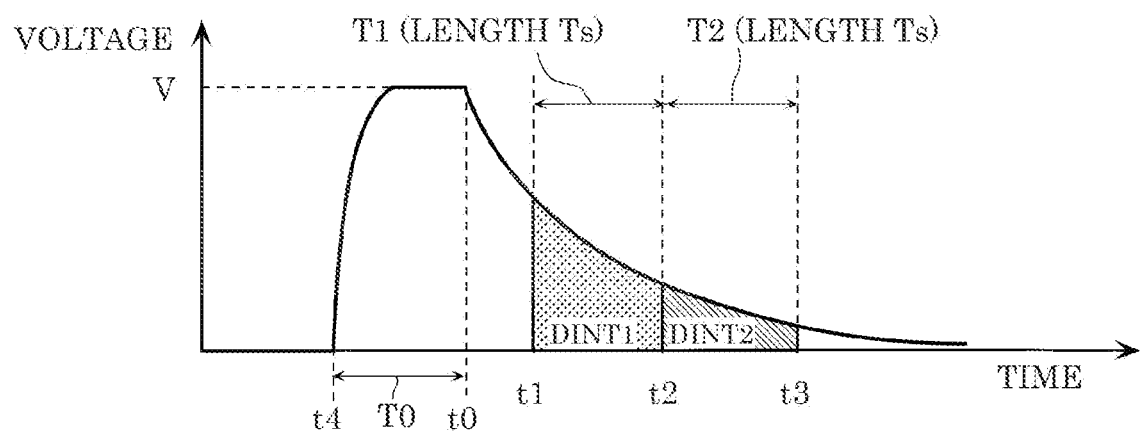
FIG. 5 is a diagram showing a voltage waveform for describing a method of calculating the time constant of the second filter unit.

Operations for calculating the time constant with the above components will be described below. FIG. 4 is a flowchart of the operations for calculating the time constant of second filter unit 104. FIG. 5 is a diagram showing a voltage waveform for describing a method of calculating the time constant of second filter unit 104.

As shown in FIG. 5, when switch 107 is off, the voltage of battery pack 101 is not applied to capacitive element 104c. That is, capacitive element 104c is not charged. Under this situation, control unit 116 charges capacitive element 104c by turning second switch 118 on (S21). Specifically, control unit 116 turns second switch 118 on at time t4 in FIG. 5 and maintains second switch 118 on during interval T0 up to time t0 (a charge interval).

At time t0, control unit 116 turns second switch 118 off (S22). This causes discharging of capacitive element 104c to be started. Second AD converter 112 measures the waveform of the voltage between second terminals 110 during the discharging of capacitive element 104c (S23). That is, second AD converter 112 measures the waveform of the voltage across capacitive element 104c during the discharging of capacitive element 104c.

The voltage across capacitive element 104c reaches a discharge-state voltage upon a lapse of a period corresponding to the time constant of second filter unit 104. Time constant calculation unit 117 then calculates the time constant of second filter unit 104 based on the waveform measured by second AD converter 112 (S24). Specifically, the time constant may be calculated using, for example, the method described with respect to above Equations 1 to 4.

In this manner, time constant calculation unit 117 can calculate the time constant of second filter unit 104 based on the waveform measured by second AD converter 112.

Figure 6:
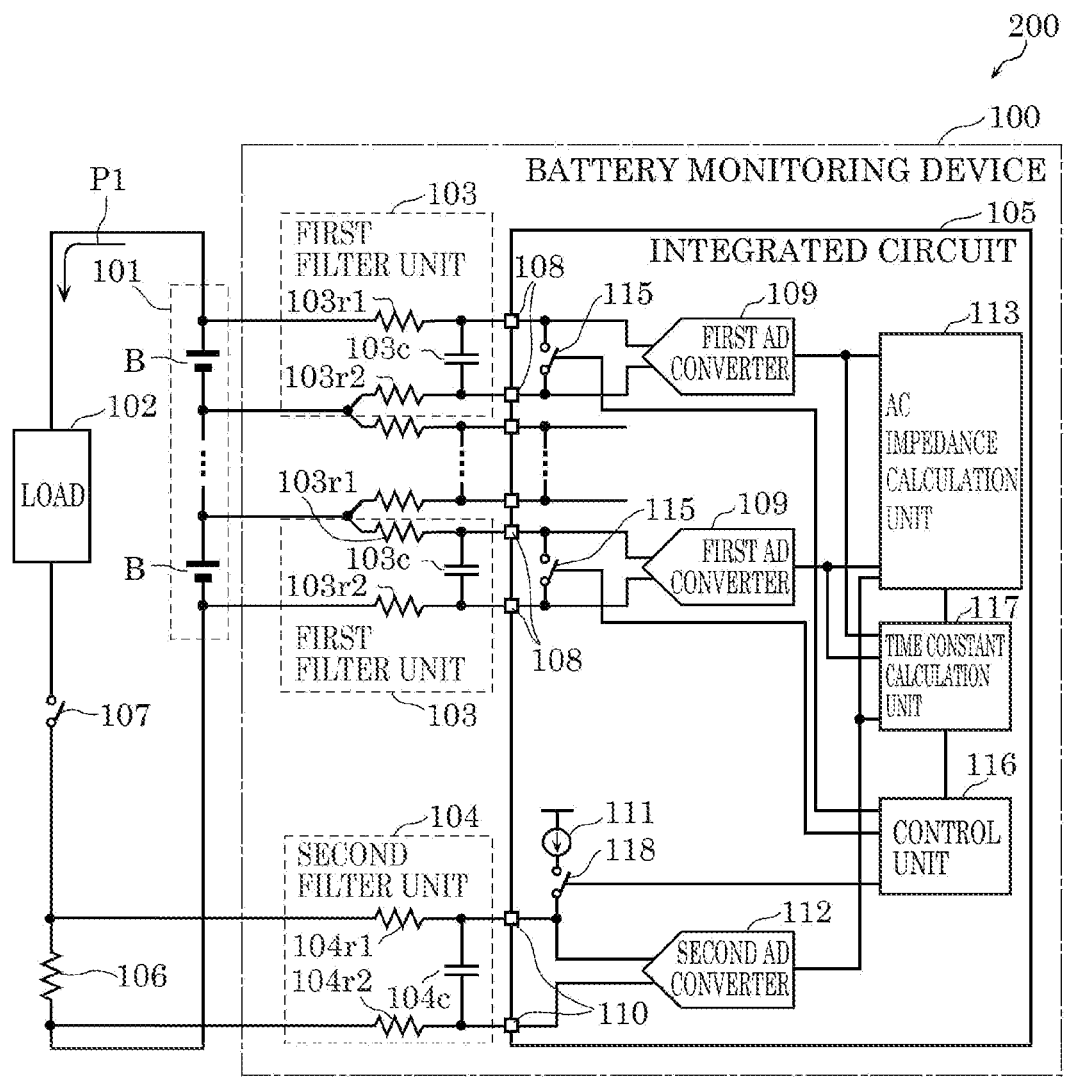
FIG. 6 is a block diagram showing a functional configuration of a battery monitoring system with modified placement of a resistor.

Although second AD converter 112 measures the voltage across resistor 106 placed in path P2, resistor 106 may alternatively be placed in path P1 of the current flowing from battery pack 101 to load 102. FIG. 6 is a block diagram showing a functional configuration of battery monitoring system 200 with modified placement of resistor 106. In the example of FIG. 6, switch 107 is also placed in path P1. Resistor 106 and switch 107 in the example of FIG. 6 are not components of battery monitoring device 100, although resistor 106 and switch 107 may be components of battery monitoring device 100.

[Correcting AC Impedance]

AC impedance calculation unit 113 can correct the AC impedance using the time constant of first filter unit 103 and time constant of second filter unit 104. A method of correcting the AC impedance will be described below.

The impedance of first filter unit 103 is expressed by Equation 5 below, where R is the resistance of resistor 103r1 and resistor 103r2, and C is the capacitance of capacitive element 103c.

[Math. 3]

$$Z = \frac{1}{j\omega 2RC + 1} = \frac{1}{j(2\pi f)2RC + 1} = \frac{1}{j(2\pi f)\tau + 1} \quad \text{Equation 5}$$

Here, ω is the angular velocity, f is the frequency, and τ is the time constant. The gain G and the phase θ in passing through first filter unit 103 are then expressed by Equations 6 and 7 below.

[Math. 4]

$$G = \frac{1}{\sqrt{1 + 4\pi^2 f^2 \tau^2}} \quad \text{Equation 6}$$

$$\theta = \tan^{-1}(2\pi f \tau) \quad \text{Equation 7}$$

A correction gain Gcomp for correcting the gain G above is expressed by Equation 8 below, and a correction phase θcomp for correcting the phase θ above is expressed by Equation 9 below.

[Math. 5]

$$G_{comp} = \frac{1}{G} = \sqrt{1 + 4\pi^2 f^2 \tau^2} \quad \text{Equation 8}$$

$$\theta_{comp} = -\theta = -\tan^{-1}(2\pi f \tau) \quad \text{Equation 9}$$

AC impedance calculation unit 113 can use a voltage correction gain GVcomp and a voltage correction phase ωVcomp to correct the voltage measured by first AD converter 109. If the voltage V measured by first AD converter 109 is expressed by Equation 10 below, a corrected voltage V is expressed by Equation 11 below.

[Math. 6]

$$V = V_{meas} \exp(j\theta_{Vmeas}) \quad \text{Equation 10}$$

$$V = G_{Vcomp} V_{meas} \exp(j(\theta_{Vmeas} + \theta_{Vcomp})) \quad \text{Equation 11}$$

Similarly, AC impedance calculation unit 113 can use a current correction gain GIcomp and a current correction phase θIcomp to correct the current measured by second AD converter 112. If the current I measured by second AD converter 112 is expressed by Equation 12 below, a corrected current I is expressed by Equation 13 below. That is, a corrected AC impedance Z is expressed by Equation 14 below.

[Math. 7]

$$I = I_{meas} \exp(j\theta_{Imeas}) \quad \text{Equation 12}$$

$$I = G_{Icomp} I_{meas} \exp(j(\theta_{Imeas} + \theta_{Icomp})) \quad \text{Equation 13}$$

$$z = \frac{V}{I} = \frac{G_{Vcomp} V_{meas} \exp(j(\theta_{Vmeas} + \theta_{Vcomp}))}{G_{Icomp} I_{meas} \exp(j(\theta_{Imeas} + \theta_{Icomp}))} \quad \text{Equation 14}$$

Advantageous Effects

As described above, integrated circuit 105 includes: a pair of terminals for measuring voltage or current of battery B and to which a filter unit including a capacitive element is connected; control unit 116 that charges or discharges the capacitive element connected between the terminals; an AD converter that measures a waveform of the voltage between the terminals during charging or discharging of the capacitive element; and time constant calculation unit 117 that calculates a time constant of the filter unit based on the waveform measured. The AD converter is first AD converter 109 or second AD converter 112, for example. The filter unit is first filter unit 103 or second filter unit 104, for example.

Integrated circuit 105 as above can calculate the time constant of the filter unit connected to the terminals for measuring the voltage or the current of battery B. The accuracy of calculating an AC impedance can be increased by correcting the AC impedance according to the time constant calculated.

For example, first terminals 108 are terminals for measuring the voltage of battery B and are electrically connected to both ends of battery B via first filter unit 103. Integrated circuit 105 further includes first switch 115 that switches first terminals 108 between a short-circuit state and an open state. Control unit 116 discharges capacitive element 103c by turning first switch 115 on to create a short circuit between first terminals 108, and then charges capacitive element 103c by turning first switch 115 off. First AD converter 109 measures the waveform of the voltage between first terminals 108 during the charging of capacitive element 103c.

Integrated circuit 105 as above can calculate the time constant of first filter unit 103 by measuring the waveform during the charging of capacitive element 103c.

For example, second terminals 110 are terminals for measuring the current of battery B and are electrically connected, via second filter unit 104, to both ends of resistor 106 serially connected to battery B. Integrated circuit 105 further includes power supply 111 and second switch 118 that switches on and off the electrical connection between power supply 111 and capacitive element 104c. Control unit 116 charges capacitive element 104c by turning second switch 118 on to electrically connect power supply 111 and capacitive element 104c, and then discharges capacitive element 104c by turning second switch 118 off. Second AD converter 112 measures the waveform of the voltage between second terminals 110 during the discharging of capacitive element 104c.

Integrated circuit 105 as above can calculate the time constant of second filter unit 104 by measuring the waveform during the discharging of capacitive element 104c.

For example, time constant calculation unit 117 calculates the time constant of the filter unit based on the integral value DINT1 in first interval T1 of the waveform measured and the integral value DINT2 in second interval T2 of the waveform measured, second interval T2 being different from first interval T1.

Integrated circuit 105 as above can calculate the time constant of the filter unit based on the integral value DINT1 in first interval T1 and the integral value DINT2 in second interval T2.

For example, integrated circuit 105 further includes AC impedance calculation unit 113 that calculates an AC impedance of battery B using the voltage and the current of battery B and the time constant of the filter unit calculated.

Integrated circuit 105 as above can calculate a highly accurate AC impedance using the time constant of the filter unit.

Battery B is one of multiple batteries B in battery pack 101.

Integrated circuit 105 as above can calculate the time constant of the filter unit connected to the terminals for measuring the voltage or the current of battery B in battery pack 101.

Battery monitoring device 100 includes integrated circuit 105 and the filter unit.

Battery monitoring device 100 as above can calculate the time constant of the filter unit.

Battery monitoring system 200 includes battery monitoring device 100 and battery B.

Battery monitoring system 200 as above can calculate the time constant of the filter unit.

Other Embodiments

Although an embodiment has been described up to this point, the present disclosure is not limited to the above-described embodiment.

For example, although a battery monitoring device that monitors a battery used in vehicles such as EVs is described in the foregoing embodiment, the battery monitoring device is may monitor a battery for any purpose.

Furthermore, although the battery monitoring system includes a battery pack in the foregoing embodiment, it is sufficient that at least one battery is included. Specifically, it is sufficient that the battery monitoring device and the integrated circuit monitor at least one battery.

Furthermore, the circuit configurations described in the foregoing embodiment are mere examples, and the present disclosure is not limited to the above-described circuit configurations. Specifically, the present disclosure also encompasses a circuit capable of realizing the characteristic functions of the present disclosure in the same manner as the above-described circuit configurations. For example, the present disclosure also encompasses a circuit configuration in which an element such as a switching element (transistor), a resistive element, or a capacitive element is connected in series or in parallel to a certain element, within a scope that realizes the same functions as the above-described circuit configurations.

Furthermore, in the foregoing embodiment, the structural components included in the integrated circuit are implemented using hardware. However, part of the structural components included in the integrated circuit may be implemented by executing a software program suitable for the structural component. Part of the structural components included in the integrated circuit may be implemented by means of a program executer, such as a CPU or a processor, reading and executing the software program recorded on a recording medium such as a hard disk or a semiconductor memory.

Furthermore, in the foregoing embodiment, processes executed by a specific processing unit may be executed by another processing unit. Moreover, in the operations described in the foregoing embodiment, the order of processes may be changed or processes may be executed in parallel.

Aside from the above, the present disclosure also encompasses forms obtained by various modification to respective embodiments that can be conceived by a person of skill in the art, or forms realized by any combination of structural components and functions in the respective embodiments without departing from the spirit of the present disclosure.

What is claimed is:

1. An integrated circuit, comprising:
   terminals which are a pair, for measuring voltage or current of a battery and to which a filter unit including a capacitive element is connected;
   an analog-to-digital (AD) converter that measures a waveform of voltage between the terminals during charging or discharging of the capacitive element;
   a time constant calculation unit that calculates a time constant of the filter unit based on the waveform measured, and
   a control unit that charges or discharges the capacitive element connected between the terminals,
   wherein the terminals are connected to both ends of the battery via the filter unit, for measuring the voltage of the battery, and
   the control unit charges the capacitive element after discharging the capacitive element by causing a short circuit between the terminals.

2. The integrated circuit according to claim 1, wherein the AD converter measures the waveform of the voltage between the terminals during the charging of the capacitive element.

3. The integrated circuit according to claim 1, wherein the terminals are electrically connected, via the filter unit, to both ends of a resistor connected in series with the battery, the terminals being for measuring the current of the battery.

4. The integrated circuit according to claim 3, comprising:
   a control unit that charges and discharges the capacitive element connected between the terminals, wherein
   the control unit discharges the capacitive element after charging the capacitive element by electrically connecting a power supply and the capacitive element.

5. The integrated circuit according to claim 3, wherein the AD converter measures the waveform of the voltage between the terminals during the discharging of the capacitive element.

6. The integrated circuit according to claim 1, wherein
   the time constant calculation unit calculates the time constant of the filter unit based on an integral value in a first interval of the waveform measured and an integral value in a second interval of the waveform measured, the second interval being different from the first interval.

7. An integrated circuit, comprising:
   terminals which are a pair, for measuring voltage or current of a battery and to which a filter unit including a capacitive element is connected;
   an analog-to-digital (AD) converter that measures a waveform of voltage between the terminals during charging or discharging of the capacitive element;
   a time constant calculation unit that calculates a time constant of the filter unit based on the waveform measured; and an AC impedance calculation unit that calculates an AC impedance of the battery using the voltage and the current of the battery and the time constant of the filter unit that has been calculated.

8. The integrated circuit according to claim 1, wherein the battery is one of a plurality of batteries included in a battery pack.

9. A battery monitoring device, comprising:
the integrated circuit according to claim 1; and
the filter unit.

10. A battery monitoring system, comprising:
the battery monitoring device according to claim 9; and
the battery.

11. A battery monitoring device, comprising:
the integrated circuit according to claim 7; and
the filter unit.

12. A battery monitoring system, comprising:
the battery monitoring device according to claim 11; and
the battery.

\* \* \* \* \*